(12) United States Patent
Shimamura et al.

(10) Patent No.: US 7,513,032 B2
(45) Date of Patent: Apr. 7, 2009

(54) METHOD OF MOUNTING AN ELECTRONIC PART TO A SUBSTRATE

(75) Inventors: Koichi Shimamura, Kawasaki (JP); Kazuyuki Ikura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 430 days.

(21) Appl. No.: 11/037,266

(22) Filed: Jan. 19, 2005

(65) Prior Publication Data
US 2006/0091555 A1 May 4, 2006

(30) Foreign Application Priority Data
Oct. 29, 2004 (JP) ............................. 2004-316407

(51) Int. Cl.
*H05K 3/30* (2006.01)

(52) U.S. Cl. ............................. 29/740; 29/729; 29/739; 29/840; 228/180.1; 228/180.22

(58) Field of Classification Search ........... 29/832–834, 29/836, 840, 842, 843, 739, 740; 228/180.21, 228/180.22, 9, 41; 438/106, 109
See application file for complete search history.

(56) References Cited

U.S. PATENT DOCUMENTS

| | | | | |
|---|---|---|---|---|
| 3,566,207 A | * | 2/1971 | Adams | ........................ 257/766 |
| 5,727,311 A | * | 3/1998 | Ida et al. | ........................ 29/832 |
| 5,839,187 A | * | 11/1998 | Sato et al. | ........................ 29/743 |
| 5,884,831 A | | 3/1999 | Sato et al. | |
| 5,934,996 A | * | 8/1999 | Nagai et al. | ................... 438/617 |
| 6,321,973 B1 | * | 11/2001 | Minamitani et al. | ......... 228/102 |
| 6,334,569 B1 | * | 1/2002 | Yoshimura | ............... 228/180.1 |
| 6,724,091 B1 | * | 4/2004 | Jayaraman et al. | .......... 257/778 |
| 6,836,959 B2 | * | 1/2005 | Watanabe et al. | ............. 29/740 |

FOREIGN PATENT DOCUMENTS

| | | |
|---|---|---|
| JP | 11-288975 | 10/1999 |
| JP | 2000-151551 | 5/2000 |

* cited by examiner

*Primary Examiner*—Minh Trinh
(74) *Attorney, Agent, or Firm*—Arent Fox LLP.

(57) ABSTRACT

A method of mounting an electronic part to a substrate, comprising: a substrate feed transporting step transporting the substrate 10 supplied to a substrate transport start position to a mounting unit 12; an electronic part supplying step supplying the electronic part 11 to the mounting unit 12; a mounting step mounting the electronic part 11 to the substrate by the mounting unit 12; and a substrate return transporting step transporting the substrate 10 to a substrate discharge position on which the electronic part has been mounted in the mounting step, wherein in the substrate feed transporting step, a carrier 100 is heated during a period when transported over a predetermined distance from the substrate transport start position; and the substrate feed transporting step, the mounting step, and the substrate return transporting step are performed while the substrate 10 is held by the carrier 100 heated during the predetermined distance.

2 Claims, 11 Drawing Sheets

METHOD OF MOUNTING AN ELECTRONIC PART TO A SUBSTRATE

BACKGROUND OF THE INVENTION

The present invention relates to a method of and an apparatus for mounting an electronic part to a substrate, which are suitably used for mounting a flip-chip type electronic part to a substrate.

In an electronic part mounting apparatus for mounting a flip-chip type electronic part to a substrate, for example, there is a fear that the substrate may be heated rapidly when soldering the electronic part onto the substrate, resulting in damage. In view of this, there have been proposed various apparatuses for mounting an electronic part to a substrate, with which the substrate is heated in advance to prevent the substrate from being heated rapidly during soldering of the electronic part onto the substrate.

Examples of conventionally proposed apparatuses for mounting an electronic part to a substrate, with which the substrate is preheated prior to mounting the electronic part to the substrate, include electronic part mounting apparatuses with which a table for holding the substrate is heated prior to mounting the electronic part to the substrate, thereby preheating the substrate. (See, for example, JP 11-288975 A, JP 2000-151551 A, and JP 10-22308 A).

SUMMARY OF THE INVENTION

However, the conventional apparatuses for mounting an electronic part to a substrate, with which the substrate is preheated prior to mounting the electronic part to the substrate, have a problem in that it takes a relatively long time for heating the substrate to a predetermined temperature because the substrate is heated only after being placed the table for holdeing the substrate to be mounted with parts, resulting in a corresponding increase in the time required for completing the mounting process.

Further, there is also a fear that the substrate may not be sufficiently preheated, resulting in damage such as deformation of the substrate during mounting, leading to a deterioration in quality.

The present invention has been made in view of the above-described problems, and an object of the invention is to provide a method of and an apparatus for mounting an electronic part to a substrate, which enable a reduction in the time required for the mounting and an improvement in quality.

To attain the above object, the present invention adopts the following device.

(1) That is, a method mounting an electronic part to a substrate according to the present invention includes: a substrate feed transporting step transporting the substrate supplied to a substrate transport start position to a mounting device; an electronic part supplying step supplying the electronic part to the mounting device; a mounting step of mounting the electronic part to the substrate by the mounting device; and a substrate return transporting step transporting the substrate, on which the electronic part has been mounted in the mounting step, to a substrate discharge position, wherein the substrate feed transporting step, the mounting step, and the substrate return transporting step are performed while the substrate is held by a carrier having a heat capacity not lower than a predetermined value; and in the substrate feed transporting step, the carrier is heated over a predetermined distance from the substrate transport start position, the substrate being heated by the carrier as the substrate is transported.

According to the present invention, the carrier having a heat capacity not lower than a predetermined value is heated during a period when transported over a predetermined distance from the substrate transport start position, and the substrate feed transporting step, the mounting step, and the substrate return transporting step are carried out while the substrate is held by this carrier, whereby the substrate is heated by the carrier as it is transported, making it possible to prevent the substrate from being heated rapidly during the mounting step.

Further, according to the present invention, the substrate can be heated as it is transported, whereby it is not necessary to stop the substrate at one location when heating the same, thereby reducing the time required for the mounting.

Further, the substrate can be sufficiently preheated, whereby it is possible to prevent the substrate from being heated rapidly at the time of mounting the electronic part to the substrate.

It is to be noted that the time required for transporting the substrate to the mounting device is relatively long. Thus, to keep the carrier at a predetermined temperature during the process, the carrier is preferably formed of a material having a large heat capacity.

(2) The method may include an underfill applying step of applying an underfill onto the substrate before or after the mounting step, the underfill being filled in between the substrate and the electronic part.

In this case, since the substrate is held by the carrier while the underfill is applied onto the substrate, the substrate is heated by the carrier, thereby promoting hardening of the underfill with the resulting heat.

(3) The method preferably includes after the substrate return transporting step: a step of accommodating the substrate on which the electronic part has been mounted into accommodating device; and an accommodated substrate heating step of heating inside the accommodating device the substrate on which the electronic part has been mounted.

In this case, heating required for hardening the underfill can be effected by the accommodated substrate heating step.

(4) An apparatus mounting an electronic part to a substrate according to the present invention includes: a substrate feed transporting device transporting the substrate supplied to a substrate transport start position to a mounting device; a mounting device for mounting the electronic part to the substrate; a substrate supplying device supplying the substrate to a predetermined position; an electronic part supplying device supplying the electronic part to the mounting device; a substrate return transporting device transporting the substrate to a predetermined position on which the electronic part has been mounted by the mounting device; a carrier which detachably holds the substrate supplied from the substrate supplying device and has a heat capacity not lower than a predetermined value; and a carrier heating and moving device moving the carrier from a substrate transport start position of the substrate feed transporting device to a predetermined position while heating the carrier.

According to the present invention, the apparatus for mounting an electronic part to a substrate can be realized by device of a simple structure, and moreover it is possible to prevent rapid heating of the substrate at the time of mounting.

(5) The apparatus preferably includes an underfill applying device applying an underfill between the substrate and the electronic part, the underfill applying device being arranged in front or behind the mounting device.

(6) The apparatus preferably includes: an accommodating device accommodating the substrate on which the electronic part has been mounted, and an accommodated substrate heating device heating inside the accommodating device the substrate on which the electronic part has been mounted.

(7) Each of the above-mentioned device is preferably formed as a unit.

In this case, the placement of the respective device each formed as a unit can be easily changed. Accordingly, even when there are changes to the usage or mounting conditions for the substrate or the electronic part, adaptation to such changes can be readily effected by changing the placement of the respective device.

As described above, according to the present invention, the substrate supplied to the substrate transport start position undergoes the steps of feed transporting, mounting, and return transporting while being held on the carrier having a predetermined heat capacity, with the carrier being heated during a period when transported over a predetermined transport distance from the substrate transport start position, whereby the substrate can be heated by the carrier as it is transported.

Therefore, it is possible to prevent rapid heating of the substrate from taking place at the time of mounting, whereby it is possible to prevent the substrate from being deformed or damaged, enabling an improvement in terms of quality. Further, the substrate does not need to be stopped at one location for heating the same, whereby the time required for the mounting process can be reduced.

DETAILED DESCRIPTION OF THE INVENTION

Figure 1:
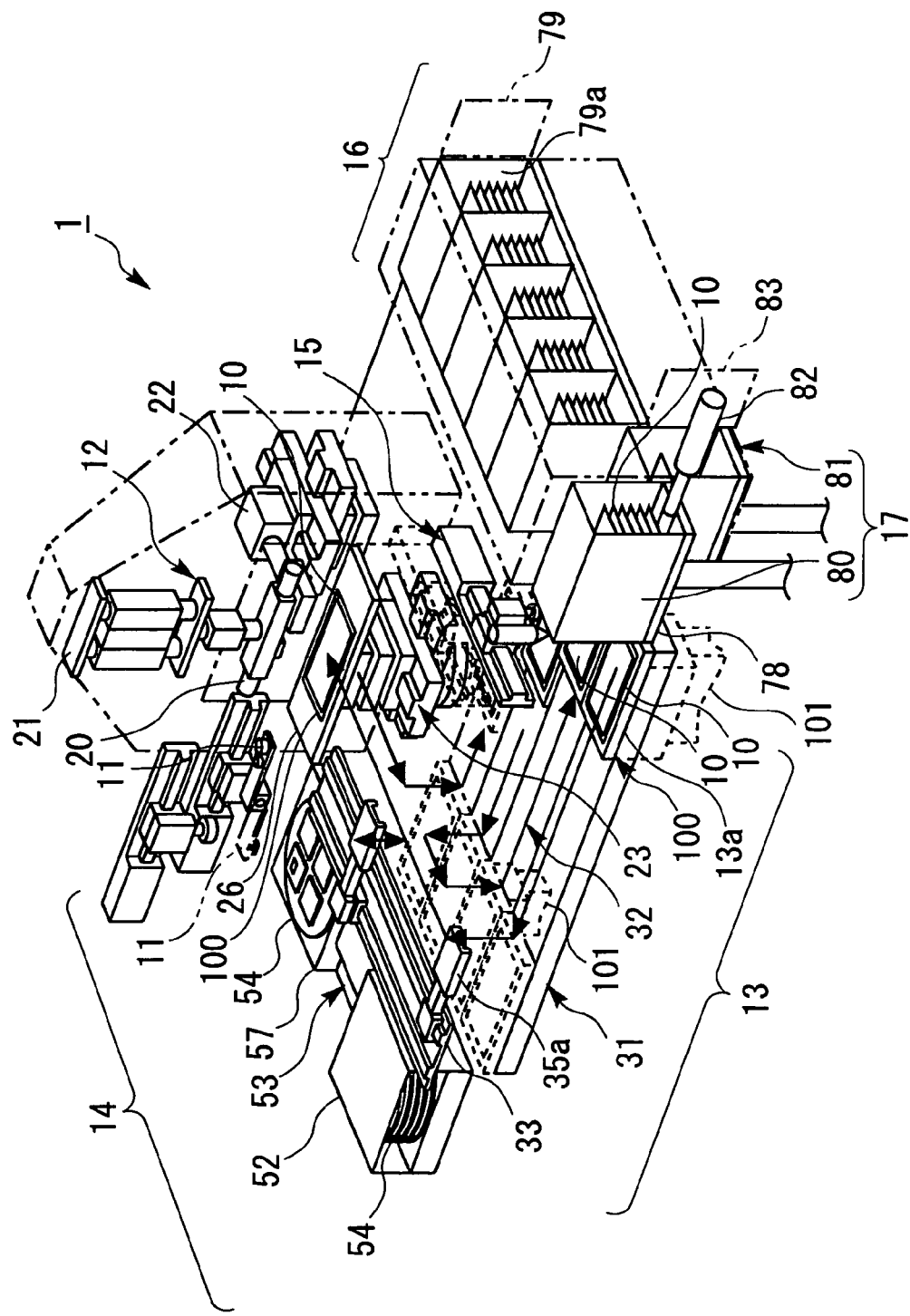
FIG. 1 is A perspective view showing an electronic part mounting apparatus according to the present invention.

Hereinbelow, embodiments of the present invention are described in detail based on the accompanying drawings, FIGS. 1 through 13. As shown in FIG. 1, an apparatus for mounting an electronic part to a substrate 1 includes: a US (ultrasonic) bonder 12 serving as a mounting device mounting an electronic part, which in this example is a flip-chip type electronic part 11 (See FIG. 13), to a substrate 10; a substrate feed transporting device 13 for transporting the substrate 10 that has been supplied to a substrate transport start position 13*a* (See FIG. 3) to the US bonder 12; an electronic part supplying device 14 transporting the electronic part 11 to the US bonder 12; an underfill applying device 15 for applying to the substrate 10 an underfill to be filled between the substrate 10 and the electronic part 11; substrate return transporting device 32 for transporting the substrate 10 on which the electronic part 11 has been mounted to a predetermined discharge position 32*a* (See FIG. 3); a constant temperature stocker 16 serving as an accommodating device accommodating the substrate 10 with the electronic part 11 mounted thereon; and a loader/unloader device 17 supplying the substrate 10 to the substrate transport start position 13*a* and discharging the substrate 10 from the substrate discharge position 32*a*.

Next, the above-mentioned respective components are described. A common substrate can be used for the substrate 10. The flip-chip type electronic part 11 described above, and other various types of electronic part may be used as the electronic part.

Figure 2:
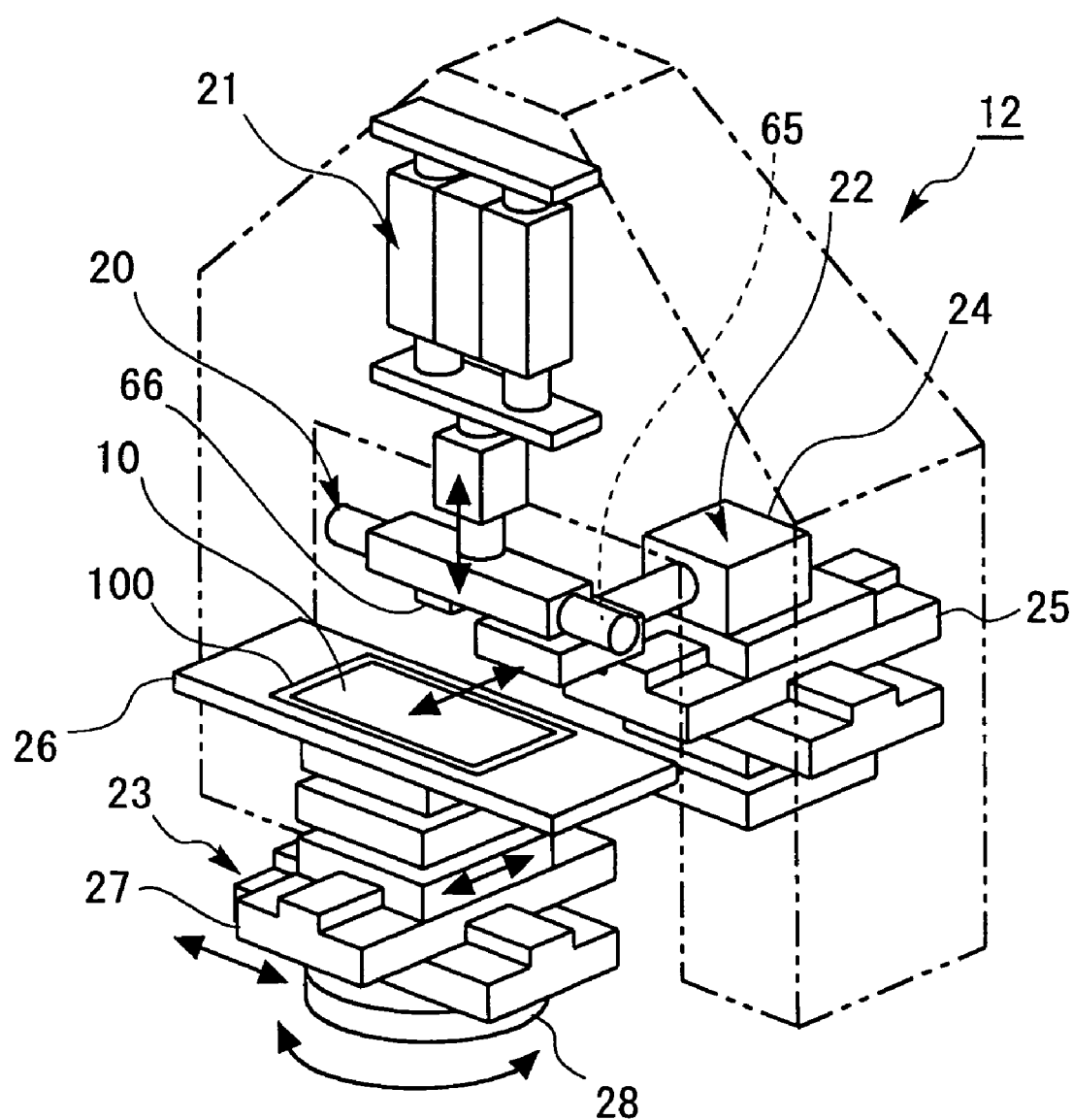
FIG. 2 is A perspective view showing a US bonder according to the present invention.

As shown in FIG. 2, the US bonder 12 mentioned above has a US (ultrasonic) head 20, a US head driver portion 21 which vertically moves the US head 20, a positional deviation detecting portion 22 which detects a positional deviation between the substrate 10 and the electronic part 11, and a positioning portion 23 which corrects the positional deviation between the substrate 10 and the electronic part 11. The US head 20 has an ultrasonic vibrator 65 and a chip absorption portion 66.

In the US bonder 12 described above, the chip absorption portion 66 receives the electronic part 11 supplied from an electronic part supplying device 14 (described later), and after the electronic part 11 is placed on the substrate 10, the electronic part 11 is bonded through solid phase reaction onto the substrate 10 through ultrasonic vibration of the ultrasonic vibrator 65.

The US head driver portion 21 vertically moves the US head 20. The positional deviation detecting portion 22 has a vertical image-taking camera 24, a lighting device (not shown), a camera moving portion 25 which moves the vertical image-taking camera 24 in the x, y, and z directions.

In the positional deviation detection portion 22, the vertical image-taking camera 24 takes images of the substrate 10 placed on a stage 26 of the positioning portion 23 and the electronic part 11 held by the chip adsorption portion 66 and arranged above the substrate 10, and detects a mark (not shown) provided on each of the substrate 10 and the electronic part 11, thereby to detect the positional deviation between the substrate 10 and the electronic part 11 immediately before the mounting process.

The positioning portion 23 has the stage 26, an XY drive portion 27 which drives the stage 26 in the x and y directions, and a rotation drive portion 28 for rotating the XY drive portion 27. Based on the result of detection by the positional deviation detecting portion 22, the stage 26 is moved in the x and y directions by a predetermined distance and rotated by a predetermined angle, thus performing positioning between the substrate 10 and the electronic part 11.

Figure 3:
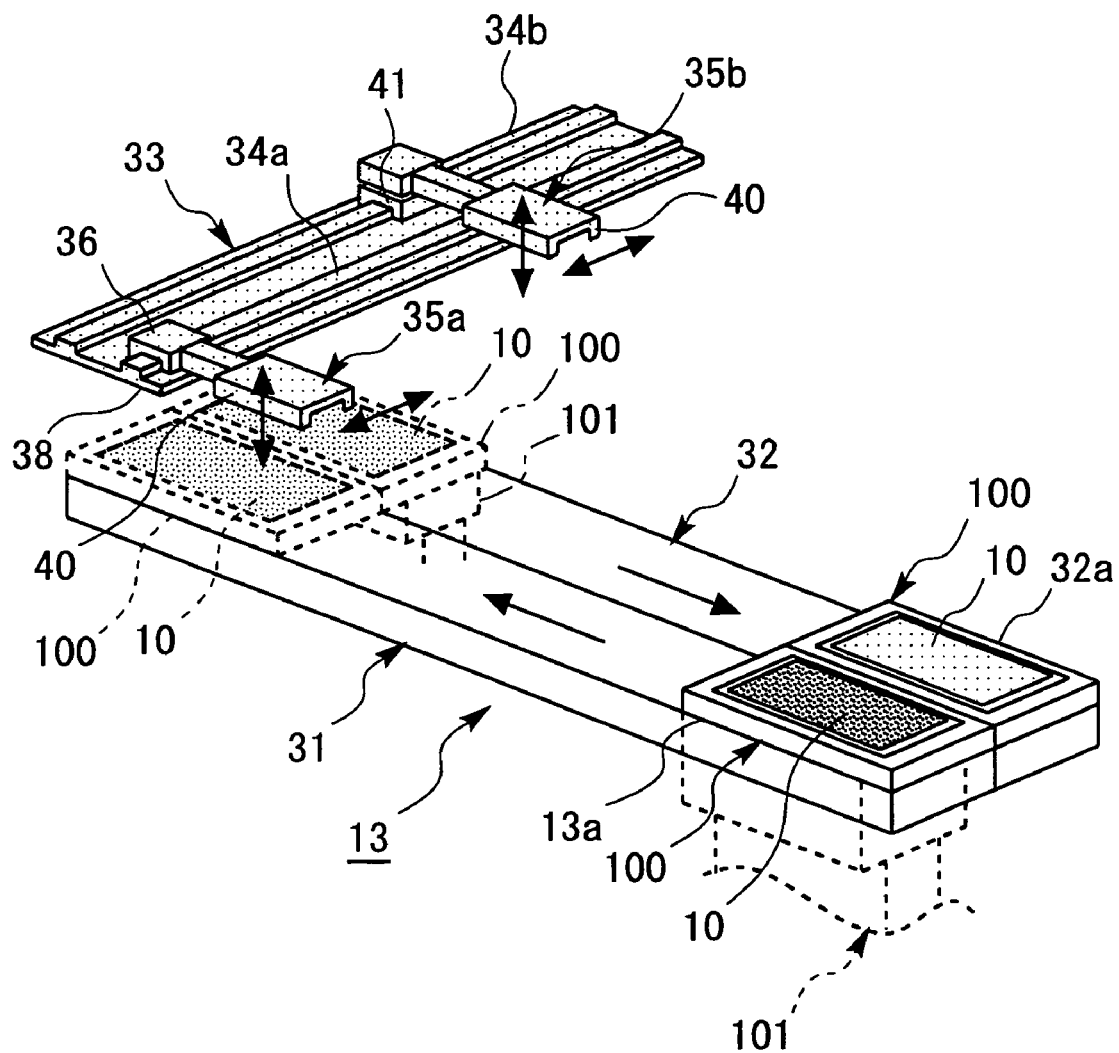
FIG. 3 is A perspective view showing substrate feed transporting device and substrate return transporting device according to the present invention.

As shown in FIG. 3, the substrate feed transporting device 13 has a substrate feed transporting portion 31 and a substrate exchanging portion 33. The substrate feed transporting portion 31 serves to transport the substrate 10 that has been supplied to the substrate transport start portion 13a to the substrate exchanging portion 33. The substrate feed transporting portion 31 is provided with a heater slider 101 serving as heating and moving device which make a horizontal reciprocating movement. A carrier 100 is transported as it is heated by the heater slider 101.

Figure 4:
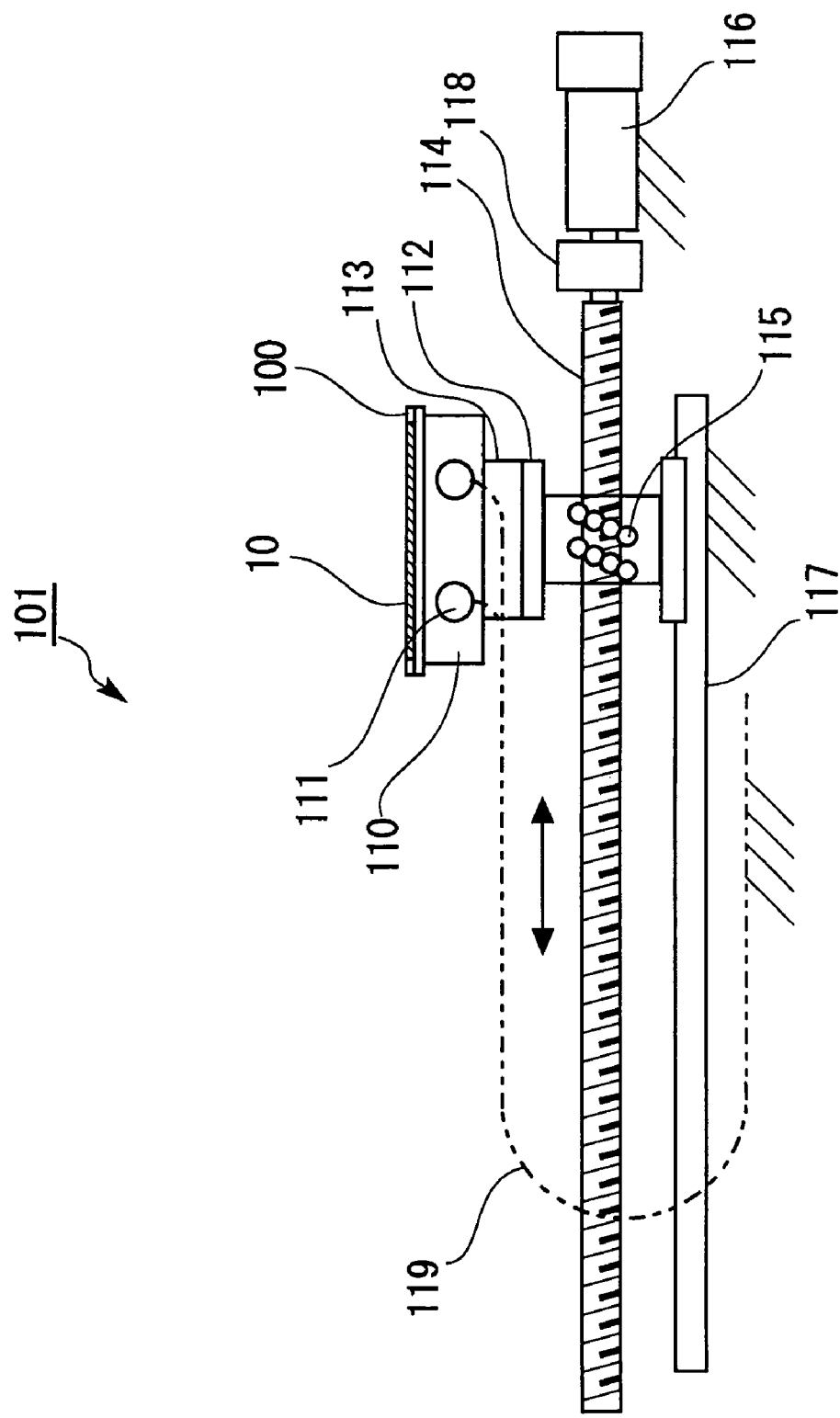
FIG. 4 is A front view showing a heater slider according to the present invention.

As shown in FIG. 4, the heater slider 101 has a heater block 110 which detachably holds the carrier 100, a heater 111 provided inside the heater block 110, a bracket 112 supporting the heater block 110, a heat insulating material 113 provided between the heater block 110 and the bracket 112, a ball screw 114 and a ball nut 115 which enable horizontal movement of the bracket 112, a motor 116 for rotating the ball screw 114, and a guide member 117 guiding the movement of the bracket 112. Note that in FIG. 4, reference numeral 118 denotes a coupling, and reference numeral 119 denotes a heater cable.

The heater slider 101 heats the carrier 100 with the heater 111 while transporting the substrate 10 through the intermediation of the carrier 100. Accordingly, there is no need to stop the substrate 10 at one location when preheating the substrate 10, making it possible to reduce the time required for the mounting process.

Figure 5:
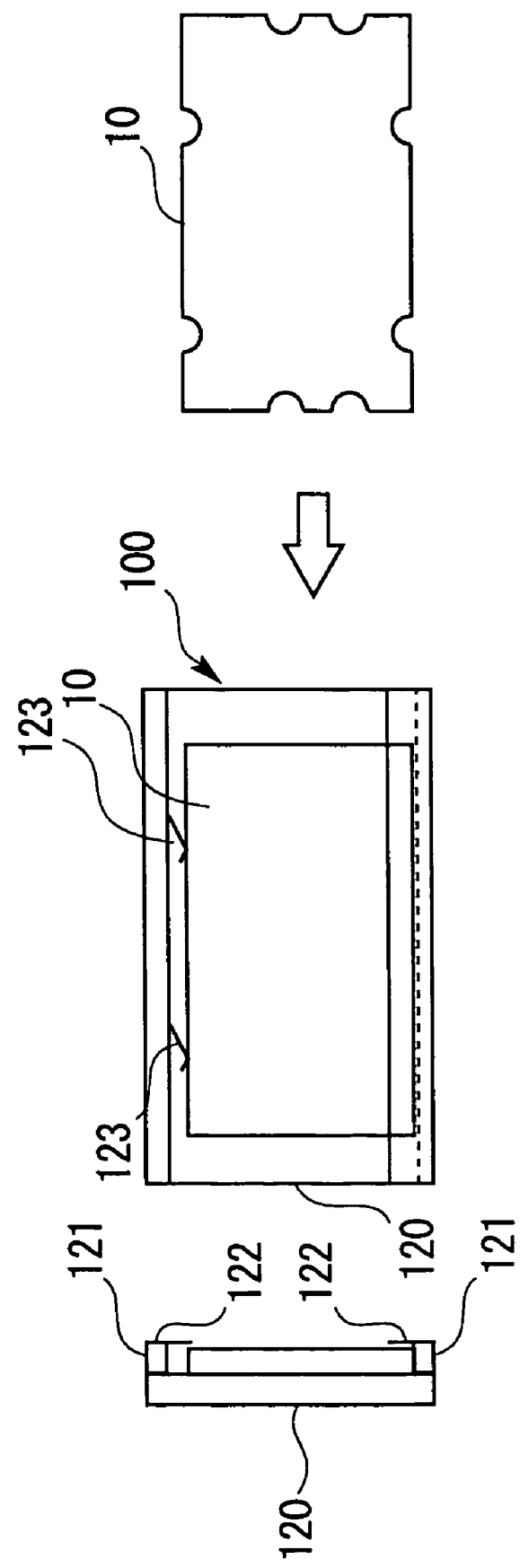
FIG. 5 is A view showing a carrier according to the present invention.

As shown in FIG. 5 the carrier 100 has a flat seat portion 120 on which the substrate 100 is placed, side wall portions 121, 122 provided on both side of the seat portion 120 to prevent the substrate 10 from falling off sideways, cover portions 122, 121 to prevent the substrate 10 from jumping upward, and a sheet spring 123 to press the substrate 10 toward one side wall portion 121, which projects from the other side portion 121 toward the opposite side wall portion 121.

The carrier 100 is formed of a material with a large heat capacity, for example stainless steel. Therefore, even when positioned away from the heater slider 101, the carrier 100 retains a predetermined temperature for a relatively long period of time to keep heating the substrate 10.

In the carrier 100, the substrate 10 supplied from a loader portion 80 (described later) is inserted between the seat portion 120 and the cover portions 122, 122 from a side of the seat portion 120. As this happens, the substrate 10 is pressed by the sheet spring 123 onto the side wall portion 121 on the opposite side from the sheet spring 123. Thus the substrate 10 is detachably held in position without inadvertently falling off from the carrier 100.

The substrate return transporting device 32 which serves to transport the substrate 10 from the substrate exchanging portion 33 to the constant temperature stocker 16, and is also provided with the same heater slider 101 as described above. The substrate 10 is heated as it is transported. Heating is thus effected on an underfill 18 applied in between the substrate 10 and the electronic part 11.

The substrate exchanging portion 33 has two transport rails 34a, 34b, which are substantially orthogonal to the substrate feed transporting portion 31 and the substrate return transporting device 32, and carrier grasping portions 35a, 35b moving on the transport rails 34a, 34b.

The carrier grasping portions 35a, 35b are moved on the transport rails 34a, 34b by device of a motor, a two-point positioning cylinder (not shown).

Figure 6:
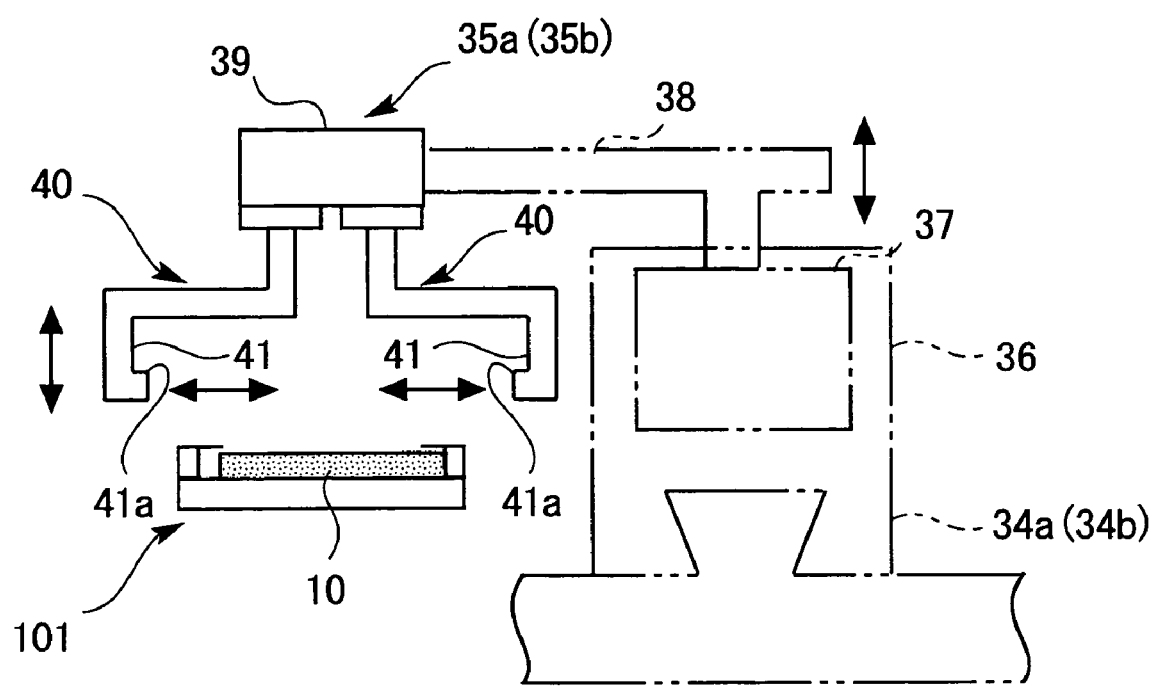
FIG. 6 is A view showing a carrier grasping portion according to the present invention.

As shown in FIG. 6, one of the carrier grasping portion 35a has a slider 36 that slides on the transport rail 34a, a cylinder 37 provided inside the slider 36, a holding member 38 raised and lowered by the cylinder 37, an opening/closing drive portion 39 provided at the distal end portion of the holding member 38, and a pair of hand portions 40, 40 opened and closed by the opening/closing drive portion 39. A cylinder or the like may be used for the opening/closing drive portion 39.

In order to grasp the carrier 100 sideways, each hand portion 40 has a recessed portion 41 having an opening 41a slightly larger than the thickness of the carrier 100 and provided at its distal end so as to face the other hand portion 40.

To grasp the carrier 100 by the carrier gasping portion 35a, first, the hand portions 40, 40 are lowered by device of the cylinder 37. The hand portions 40, 40 are opened at this time. Then, the recessed portions 41, 41 of the hand portions 40, 40 are arranged just to the right and left of the carrier 100.

Subsequently, the hand portions 40, 40 are closed by the opening/closing drive portion 39. As a result, the recessed portions 41, 41 of the hand portions 40, 40 are fitted into both side end portions of the carrier 100. In this state, the hand portions 40, 40 are raised by device of the cylinder 37.

The other carrier grasping portion 35b has basically the same construction as the carrier grasping portion 35a. Note that, however, as shown in FIG. 3, in order to prevent collision between the carrier grasping portions 35a, 35b as they move to a direction approaching each other, a second slider 41 having a predetermined thickness is provided under the slider 36 of the carrier grasping portion 35b.

Therefore, the carrier grasping portion 35b is positioned higher than the other carrier grasping portion 35a, making it possible to prevent the carrier grasping portions 35a, 35b from colliding against each other. Note that FIG. 3 depicts the components of the carrier grasping portions 35a, 35b in a simplified fashion and hence differs from the illustration of FIG. 6.

Figure 7:
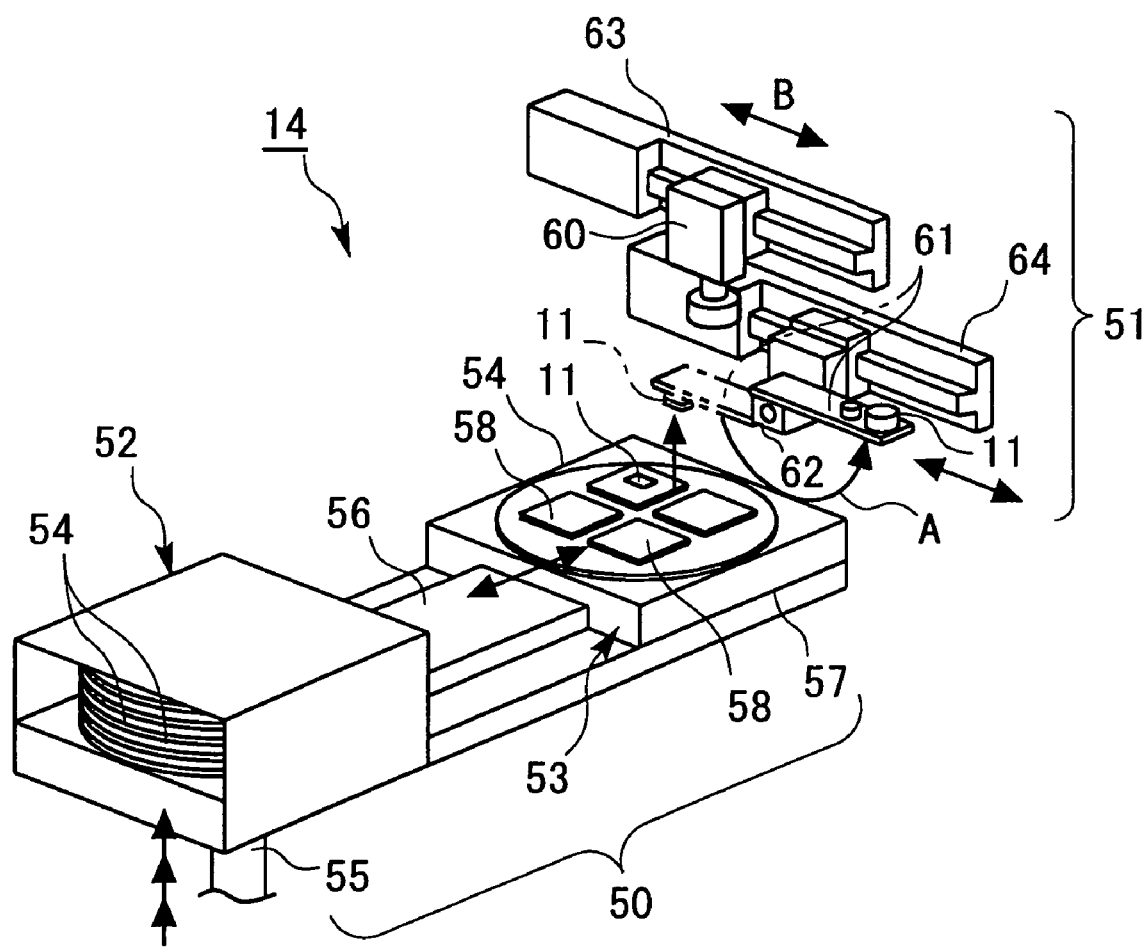
FIG. 7 is A perspective view showing electronic part supplying device according to the present invention.

As shown in FIG. 7, the electronic part supplying device 14 has an electronic part extracting portion 50 and an electronic part handling portion 51. The electronic part extracting portion 50 has a magazine tray accommodating portion 52 and a magazine tray moving portion 53.

Multiple magazine trays 54 are accommodated in the magazine tray accommodating portion 52 such that they can be freely inserted into or extracted from the magazine tray accommodating portion 52. The magazine tray accommodating portion 52 is raised and lowered stepwise by a raising and lowering drive portion 55, by an amount corresponding to a thickness of one magazine tray 54 at a time. Each magazine tray 54 receives multiple chip trays 58. Further, multiple electronic parts 11 are placed on each chip tray 58.

The magazine tray moving portion 53 has a guide rail 56 extending from the magazine tray accommodating portion 52 to the electronic part handling portion 51, and a magazine tray stage 57 which makes reciprocating movement on the guide rail 56.

Further, the electronic part handling portion 51 has a chip recognition portion 60 and a chip adsorption and reversal portion 61. The chip recognition portion 60 recognizes the electronic part 11 located directly below it with a camera. The chip recognition portion 60 makes horizontal movement in the arrow B direction by device of a linear drive portion 63.

The chip adsorption and reversal portion 61 adsorbs a predetermined one of the multiple electronic parts 11 on the magazine tray stage 57 and rotates in the arrow A direction about a rotation shaft 62. This changes the orientation of the electronic part 11 from a downward facing orientation at the time of absorption to an upward facing one. The chip adsorption and reversal portion 61 moves horizontally in the arrow B direction by device of the linear drive portion 64.

To supply the electronic part 11 to the US bonder 12, the magazine tray 54 received in the magazine tray accommodating portion 52 is placed onto the magazine tray stage 57, and then the magazine tray stage 57 slides on the guide rail 56, thus bringing the electronic part 11 to a position directly below the electronic part handling portion 51.

Subsequently, the chip recognition portion 60 of the electronic part handling portion 51 recognizes a predetermined one of the electronic parts 11 on the chip trays 58 received on the magazine tray 54 on the magazine tray stage 57.

Subsequently, the chip adsorption and reversal portion 61 moves down and the electronic part 11 recognized as described above is adsorbed. The chip adsorption and reversal portion 61 then ascends and rotates in the arrow A direction about the rotation shaft 62.

Subsequently, the chip adsorption and reversal portion 61 moves horizontally in the arrow B direction by mean of the linear drive portion 64. The chip adsorption and reversal portion 61 then moves down, and the electronic part 11 is supplied onto the substrate 10 placed on the stage 26 of the US bonder 12 (See FIG. 1).

Figure 8:
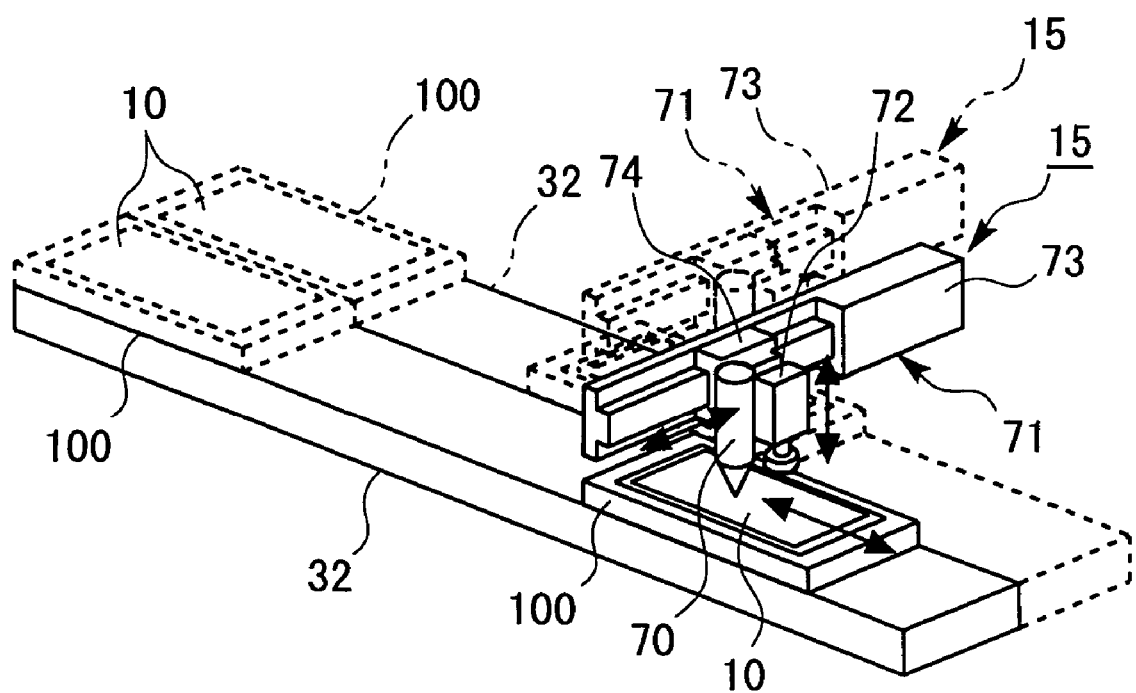
FIG. 8 is A perspective view showing underfill applying device according to the present invention.

As shown in FIG. 8, the underfill applying device 15 is equipped with an UF (underfill) applying unit 70, an applying unit driver portion 71 which horizontally moves as well as raises and lowers the UF applying unit 70, and a position recognition camera 72.

The UF applying unit 70 discharges an underfill onto the substrate 10 through a dispenser. The UF applying unit driver portion 71 has a horizontal drive portion 73 and a vertical drive portion 74.

It should be noted that while FIG. 8 depicts the case where there are provided two rows of the substrate return transporting device 32, with one underfill applying device 15 provided on each of the substrate return transporting device 32. It is also possible to provide one or three or more substrate return transporting device 32 and underfill applying device 15.

Figure 9:
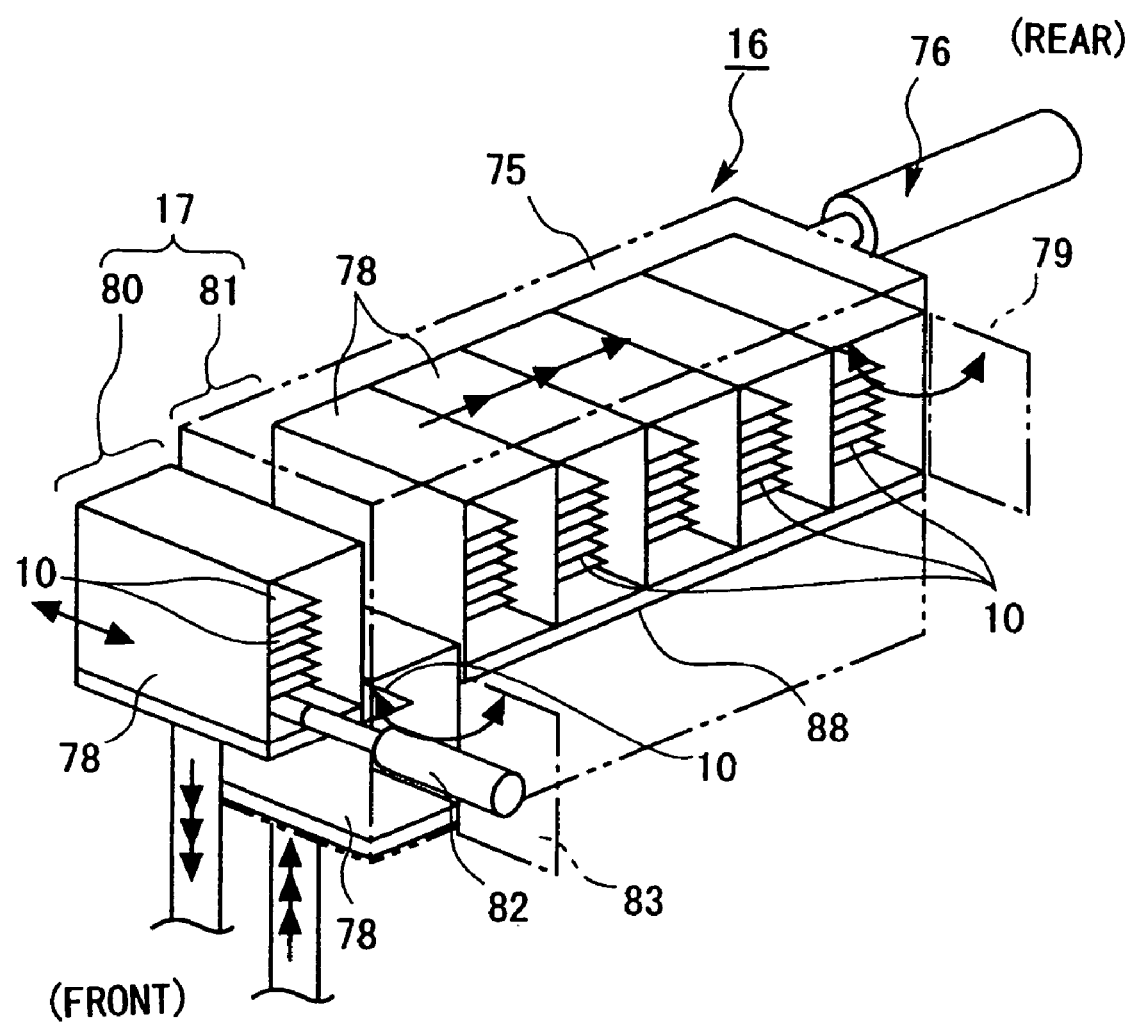
FIG. 9 is A perspective view showing a constant temperature stocker and loader/unloader device according to the present invention.

A shown in FIG. 9, the constant temperature stocker 16 has a box-like constant temperature chamber 75 and a magazine horizontal movement portion 76 provided at the rear end portion of the constant temperature chamber 75.

The interior of the constant temperature chamber 75 is heated to and retained at a predetermined temperature by a heater (not shown). Accordingly, the substrates 10 and the electronic parts 11 accommodated in magazines 78 inside the constant temperature chamber 75 are heated at the predetermined temperature. Note that the constant temperature chamber 75 has at its rear end portion a door 79 for extracting the magazines 78.

Figure 10:
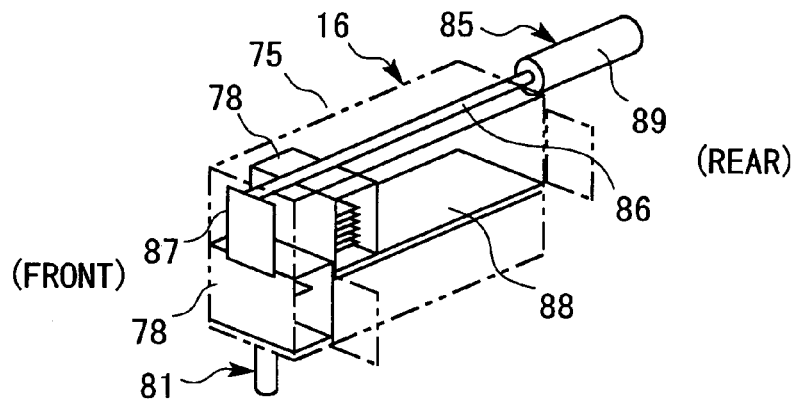
FIG. 10 is A perspective view showing a magazine stand-by state in a method of accommodating magazines according to the present invention.

As shown in FIG. 10, the magazine horizontal movement portion 76 has a straightway actuator 85 provided outside the constant temperature chamber 75. The straightway actuator 85 has a retractable rod 86, and a locking plate 87 provided at the distal end of the rod 86 and protruding downwardly.

The rod 86 of the straightway actuator 85 is arranged on an upper side of the constant temperature chamber 75 so as not to interfere with the magazines 78. Further, the locking plate 87 is arranged at a position where it is capable of locking engagement with a side surface of the magazine 78 inserted at the front end portion of the constant temperature chamber 75. Note that in FIG. 10, reference numeral 88 denotes a magazine rail on which the magazines 78 slide.

Figure 11:
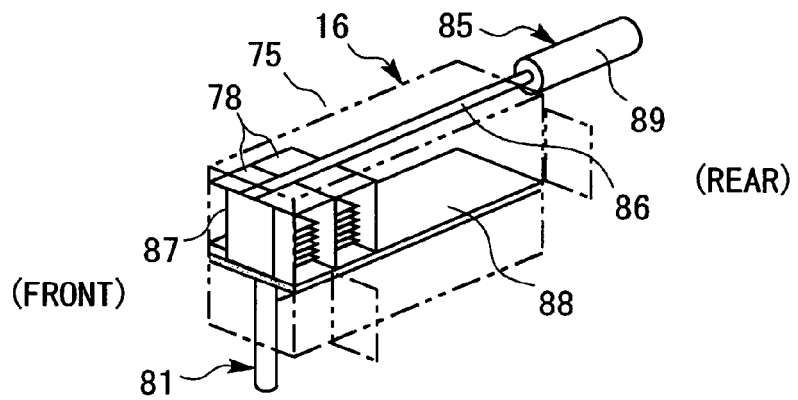
FIG. 11 is A perspective showing a state in which a predetermined number of substrates are accommodated in the magazines according to the present invention.

In accommodating the magazines 78 into the constant temperature stocker 16, as shown in FIG. 11, the magazine 78 inside the constant temperature chamber 75 is raised to a predetermined height by a loader portion 80, and a predetermined number of substrates are accommodated into the magazine 78. At this time, the locking plate 87 provided to the rod 86 of the straightway actuator 85 is arranged opposed to a side surface of the magazine 78.

Figure 12:
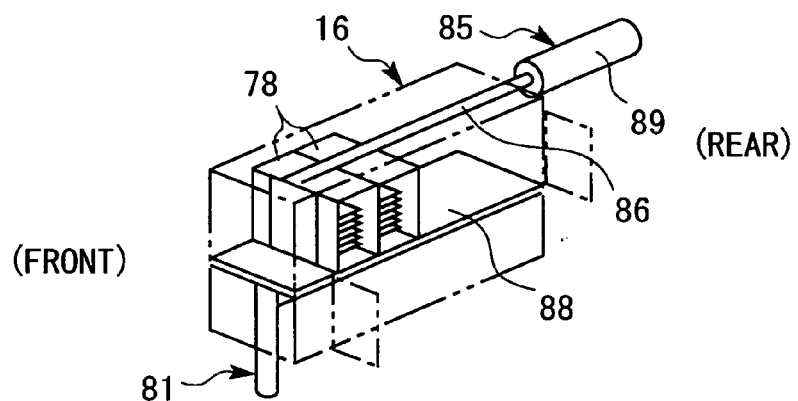
FIG. 12 is A perspective view showing a state in which the magazines according to the present invention have moved horizontally into a constant temperature stocker.
Figure 13:
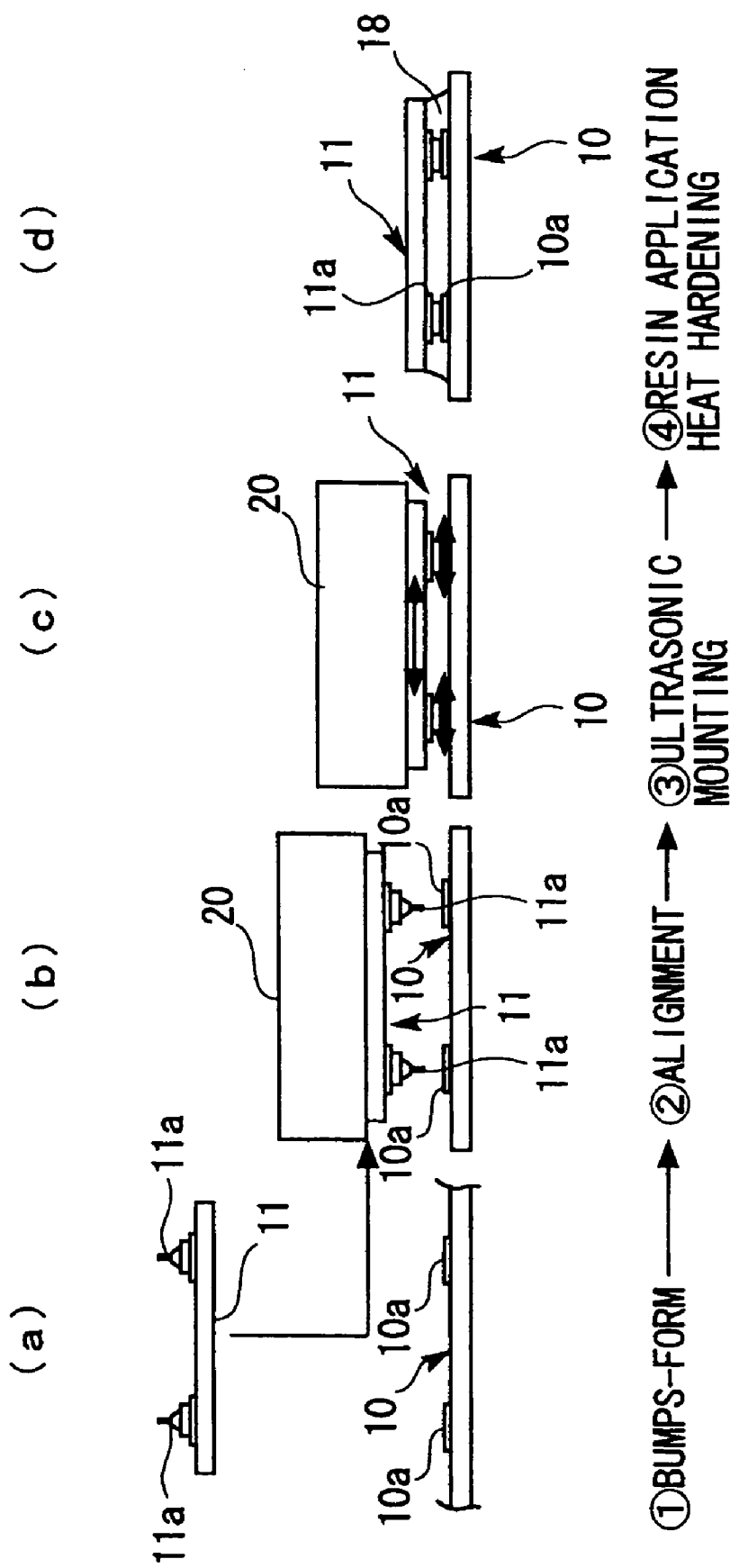
FIG. 13 is Views showing a method of mounting an electronic part to a substrate according to the present invention, of which FIG. 13(*a*) is a view showing terminals on the substrate and bumps on an electronic part, FIG. 13(*b*) is a view in which the electronic part is placed above the substrate, FIG. 13(*c*) is a view showing a state that the electronic part is ultrasonic-welded onto the substrate, and FIG. 13(*d*) is a view showing a state where an underfill is applied.

Then, as shown in FIG. 12, the rod 86 of the straightway actuator 85 is retracted into a main body 89. As a result, the locking plate 87 provided at the distal end of the rod 86 comes into locking engagement with the side surface of the magazine 78 and then moves horizontally, so that the magazine 78 moves horizontally toward the rear side of the constant temperature chamber 75.

The straightway actuator 85 stops upon horizontal movement of the magazine 78 by a distance corresponding to one magazine. Subsequently, the rod 86 is extended, bringing the locking plate 87 to the original stand-by position (See FIG. 10). The above-mentioned operations, namely raising the magazine, accommodating the substrates, and horizontally moving the magazine are repeated, whereby a predetermined number of the magazines 78 are accommodated into the constant temperature chamber 75.

As shown in FIG. 9, the loader/unloader device 17 has the loader portion 80 for raising each magazine 78 accommodating the substrates 10 in a stepwise manner by an amount corresponding to one substrate at a time, and the unloader portion 81 for lowering each magazine 78 in a stepwise manner by an amount corresponding to one substrate at a time in order to accommodate the substrates 10 with the electronic parts 11 mounted thereon into the magazine 78.

The loader portion 80 is provided with a substrate ejection portion 82 for pushing out the substrates 10 in the magazine 78 one by one. The unloader portion 81 is arranged inside the constant temperature chamber 75. Further, provided at a rear end portion of the constant temperature chamber 75 is a door 83 for supplying an empty magazine 78 into the unloader portion 81.

The unloader portion 81 lowers the magazine 78 in a stepwise manner. Then, the substrates 10 are accommodated in order into the thus lowered magazine 78 from the lower side thereof.

The substrate feed transporting device 13, the substrate exchanging portion 33, the electronic part supplying device 14, the US bonder 12, the substrate return transporting device 33, the underfill applying device 15, the constant temperature stocker 16, and the loader/unloader device 17 are each formed as a unit.

Now, an operation of the apparatus for mounting an electronic part to a substrate 1 is described. As shown in FIG. 1, when mounting the electronic part 11 to the substrate 10, of the substrates 10 accommodated inside the magazine 78 in the loader portion 80 of the loader/unloader device 17, the substrate 10 situated on the bottom is pushed out by the substrate push-out portion 82 to the substrate transport start position 13a on the substrate feed transporting device 13.

The substrate 10 thus pushed out is inserted into the carrier 100 on the substrate feed transporting portion 31 and retained in position. Then, the carrier 100 is transported to the substrate exchanging portion 33 by the heater slider 101. At this time, the substrate 10 inside the carrier 100 is heated by the heater 11 inside the heater slider 101. That is, the substrate 10 is heated as it is transported.

When the carrier 100 reaches the substrate exchanging portion 33, the carrier 100 is held by the carrier grasping portion 35a in the substrate exchanging portion 33, and then the carrier grasping portion 35a moves up. Subsequently, the carrier grasping portion 35a moves toward the US bonder 12 side, transporting the carrier 100 and the substrate 10 to the US bonder 12 side.

Since the carrier 100 has a large heat capacity, while the carrier 100 is transported to the US bonder 12 side by the carrier grasping portion 35a, the carrier 100 is retained at a predetermined temperature although the carrier 100 is separated from the heater slider 101. Accordingly, the substrate 10 remains heated by the carrier 100 all the while it is transported.

Subsequently, after placed on the stage 26 of the US bonder 12 while holding the substrate 10, the carrier 100 is held by appropriate holding device (not shown).

On the other hand, in the electronic part supplying device 14, one magazine tray 54 is pushed out from the magazine tray accommodating portion 52 and placed onto the magazine tray stage 57 of the magazine tray moving portion 53.

Next, the magazine tray stage 57 is moved toward the US bonder 12. Then, one electronic part 11 placed on the chip tray 58 on the magazine tray stage 57 is recognized by the chip recognition portion 60 of the electronic part handling portion 51.

Next, the electronic part 11 thus recognized is adsorbed by the chip adsorption and reversal portion 61. The electronic part 11 is oriented downward at this time. Then, the chip adsorption and reversal portion 61 rotates by 180 degrees in the arrow A direction (See FIG. 7) about the rotation shaft 62. As a result, the electronic part 11 is reversed from the downward orientation to the upward orientation.

Next, the chip adsorption and reversal portion 61 is moved horizontally to a predetermined position by the linear drive portion 63 (See FIG. 7). Then, the electronic part 11 adsorbed on the chip adsorption and reversal portion 61 is adsorbed by the US head 20 of the US bonder 12. Subsequently, the electronic part 11 thus adsorbed by the US head is placed at a position opposed to a predetermined position on the substrate 10.

Next, positional deviation between the substrate 10 and the electronic part 11 is detected by the positional deviation detecting portion 22 of the US bonder 12. Then, the positioning portion 23 is driven based on the result of the detection by the positional deviation detecting portion 22, and the substrate 10 is moved to a predetermined position. As a result, the substrate 10 and the electronic part 11 are aligned in position with good accuracy.

Subsequently, the US head 20 moves down, placing and joining the electronic part 11 onto the predetermined position on the substrate 10.

FIGS. 13(a) through (d) illustrate the mounting process through which the electronic part 11 is bonded onto the substrate 10. As shown in FIG. 13(a), terminals 10a are provided at predetermined positions on the substrate 10. Further, the electronic part 11 is provided with AU bumps 11a at its predetermined positions.

When, as shown in FIG. 13(b), the electronic part 11 is reversed to be placed above the substrate 10, the terminals 10a of the substrate 10 and the Au bumps 11a of the electronic part 11 are placed into alignment with each other.

Next, as shown in FIG. 13(c), as the electronic part 11 moves down, the Au bumps 11a are placed onto the terminals 10a of the substrate 10, bonding the Au bumps 11a are fused onto the terminals 10a through ultrasonic vibration of the US head 20.

Next, as shown in FIG. 13(d), the underfill 18 is filled in between the substrate 10 and the electronic part 11. As described above, in this example, the application of the underfill 18 is performed by the underfill applying device 15 immediately before the substrate 10 is accommodated into the constant temperature stocker 16.

After the electronic part 11 is bonded onto the substrate 10 by the US bonder 12 as described above, the carrier 100 on the stage 26 is grasped by the carrier grasping portion 35b and placed onto the heater slider 101 on the substrate return transporting device 32.

Then, the heater slider 101 moves toward the constant temperature stocker 16, and the substrate 10 mounted with the carrier 100 and the electronic part 11 is transported toward the constant temperature stocker 16.

The heater slider 101 stops when the carrier 100 and the mounting-completed substrate 10 are transported to a position immediately in front of the constant temperature stocker 16. Then, the underfill 18 is applied in between the substrate 10 and the electronic part 11 by the underfill applying device 15.

Next, the mounting-completed substrate 19 on the carrier 100 is accommodated into the magazine 78 on the unloader portion 81 inside the constant temperature stocker 16.

The unloader portion 81 ascends by a distance corresponding to one substrate each time one mounting-completed substrate 10 is accommodated into the magazine 78. Then, after a predetermined number of the substrates 10 are accommodated into the magazine 78, the magazine 78 is moved horizontally by the magazine horizontal movement portion 76 by a distance corresponding to one magazine.

In this way, a predetermined number of the magazines 78 are accommodated into the constant temperature stocker 16. Subsequently, the door 79 is opened to extract each magazine 78 through a discharge opening 79a. As described above, the magazines 78 are accommodated in the constant temperature stocker 16 for a predetermined period of time. Meanwhile, the interior of the constant temperature stocker 16 is heated by the heater. Accordingly, the magazines 78 are heated for a predetermined period of time.

In this way, the mounting-completed substrate 10 inside each magazine 78 is heated for a predetermined period of time, so that the underfill 18 applied in between the substrate 10 and the electronic part 11 is heated to cure.

As described above, according to the apparatus for mounting an electronic part to a substrate 1 of the present invention, the carrier 100 having a heat capacity of a predetermined value or higher is heated over a predetermined distance from the transport start position for the substrate 10, and the substrate feed transporting step, the mounting step, and the substrate return transporting step are carried out with the carrier 100 holding the substrate 10, whereby the substrate 10 is heated with the residual heat of the carrier 100 throughout those steps.

Accordingly, it is possible to prevent the substrate 10 from being rapidly heated during the mounting process and therefore prevent the substrate 10 from being deformed or damaged, making it possible to achieve an improvement in the quality of the mounting-completed substrate 10.

Further, according to the present invention, the substrate 10 is heated as it is transported, there is no need to stop the substrate 10 at one location to heat the same. Thus, it is possible to reduce the time required for the mounting process. Further, the carrier 100 is formed of a material having a large heat capacity, for example stainless steel, whereby even when it takes a relatively long time to transport the substrate 10 to the US bonder 12, it is possible to prevent the carrier 100 from cooling down in the meantime.

Further, the step of applying the underfill in between the substrate 10 and the electronic part 11 is performed before or after the mounting step, whereby the underfill can be applied while the carrier 100 holds the substrate 10.

Accordingly, the underfill 18 can be heated with the heat of the carrier 100 while the underfill 18 is being applied, thereby facilitating curing of the underfill.

Further, the magazines 78 and the mounting-completed substrates 10 accommodated in the magazines 78 are heated inside the constant temperature stocker 16, thereby facilitating curing of the underfill 18.

Further, in the apparatus for mounting an electronic part to a substrate 1, each of the respective device described above is formed into a unit, making it possible to readily change the placement of the respective device each formed as a unit. Therefore, adaptation to changes in the mounting conditions or the installation location can be readily effected by adjusting the placement of the respective device each formed as a unit.

What is claimed is:

1. A method of mounting an electronic part to a substrate, comprising:
    a substrate feed transporting step, transporting the substrate supplied to a substrate transport start position to a mounting device;
    an electronic part supplying step, supplying the electronic part to the mounting device;
    a mounting step, mounting the electronic part to the substrate by the mounting device; an underfill applying step, applying an underfill onto the substrate after the mounting step, the underfill being filled between the substrate and the electronic part, and
    a substrate return transporting step, transporting the substrate to a substrate discharge position on which the electronic part has been mounted in the mounting step,
    wherein the substrate is held by a carrier having a heat capacity not lower than a predetermined value,
    in the substrate feed transporting step, a heater slider heats the carrier when the carrier is within a predetermined distance from the substrate transport start position and
    in the mounting step, the substrate is heated by a residual heat of the carrier, after being separated from the heater slider.

2. The method of mounting an electronic part to a substrate according to claim 1, further comprising: a step accommodating the substrate on which the electronic part has been mounted into an accommodating device; and an accommodated substrate heating step heating inside the accommodating device the substrate on which the electronic part has been mounted, after the substrate return transporting step.

* * * * *